United States Patent
Lee et al.

(10) Patent No.: US 10,489,061 B2
(45) Date of Patent: Nov. 26, 2019

(54) SHIFT READ COMMAND FOR PERFORMING RANK-TO-RANK TRANSFERS IN SEMICONDUCTOR MEMORY DEVICES

(71) Applicant: Samsung Electronics Co., Ltd., Suwon-si, Gyeonggi-do (KR)

(72) Inventors: Seong Jin Lee, Hwaseong-si (KR); Ji Hyun Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 15/889,539

(22) Filed: Feb. 6, 2018

(65) Prior Publication Data

US 2019/0065074 A1 Feb. 28, 2019

(30) Foreign Application Priority Data

Aug. 23, 2017 (KR) .................. 10-2017-0106776

(51) Int. Cl.
*G06F 3/06* (2006.01)
*G11C 11/4076* (2006.01)
(Continued)

(52) U.S. Cl.
CPC .......... *G06F 3/0613* (2013.01); *G06F 3/0658* (2013.01); *G06F 3/0659* (2013.01); *G06F 3/0673* (2013.01); *G11C 5/04* (2013.01); *G11C 7/1018* (2013.01); *G11C 7/22* (2013.01); *G11C 7/222* (2013.01); *G11C 11/408* (2013.01); *G11C 11/4076* (2013.01); *G11C 11/4093* (2013.01)

(58) Field of Classification Search
None
See application file for complete search history.

(56) References Cited

U.S. PATENT DOCUMENTS 5,430,676 A * 7/1995 Ware .................. G11C 5/066
  365/189.02
7,895,479 B2   2/2011 Porterfield
(Continued)

OTHER PUBLICATIONS

Kim, Yoongu, et al. "A case for exploiting subarray-level parallelism (SALP) in DRAM." ACM SIGARCH Computer Architecture News 40.3 (2012): 368-379. (Year: 2012).*

*Primary Examiner* — Charles Rones
*Assistant Examiner* — Hewy H Li
(74) *Attorney, Agent, or Firm* — Harness, Dickey & Pierce, P.L.C.

(57) ABSTRACT

A first rank includes a plurality of first semiconductor memory devices, and a second rank includes a plurality of second semiconductor memory devices. The command/address signal lines are shared by a controller, the first rank, and the second rank, and the data lines are shared by the controller, the first rank, and the second rank. When performing a data movement operation of moving data between the first rank and the second rank, the controller applies a shift read command to one of the first rank and the second rank through the command/address signal lines and applies a normal write command or a shift write command to another of the first rank and the second rank through the command/address signal lines after a time corresponding to a value obtained by subtracting the value of the write latency from the value of the read latency.

20 Claims, 10 Drawing Sheets

(51) Int. Cl.
*G11C 7/22* (2006.01)
*G11C 11/408* (2006.01)
*G11C 11/4093* (2006.01)
*G11C 5/04* (2006.01)
*G11C 7/10* (2006.01)

(56) References Cited

U.S. PATENT DOCUMENTS

| | | |
|---|---|---|
| 8,296,541 B2 | 10/2012 | Gower et al. |
| 8,782,458 B2 | 7/2014 | Nygren et al. |
| 9,213,657 B2 | 12/2015 | Zerbe et al. |
| 9,368,172 B2 | 6/2016 | Palmer et al. |
| 9,407,424 B1 | 8/2016 | Holla et al. |
| 9,619,409 B2 | 4/2017 | Hsu et al. |
| 2003/0198098 A1* | 10/2003 | Fujioka ................ G11C 7/1051 365/200 |
| 2004/0008069 A1* | 1/2004 | Welker ................ G11C 7/1078 327/278 |
| 2007/0156996 A1 | 7/2007 | Chung |
| 2009/0182914 A1* | 7/2009 | Matsui ................ G11C 7/1075 710/100 |
| 2017/0194039 A1* | 7/2017 | Funaki .................... G11C 5/02 |
| 2017/0371539 A1* | 12/2017 | Mai .......................... G06F 3/061 |

\* cited by examiner

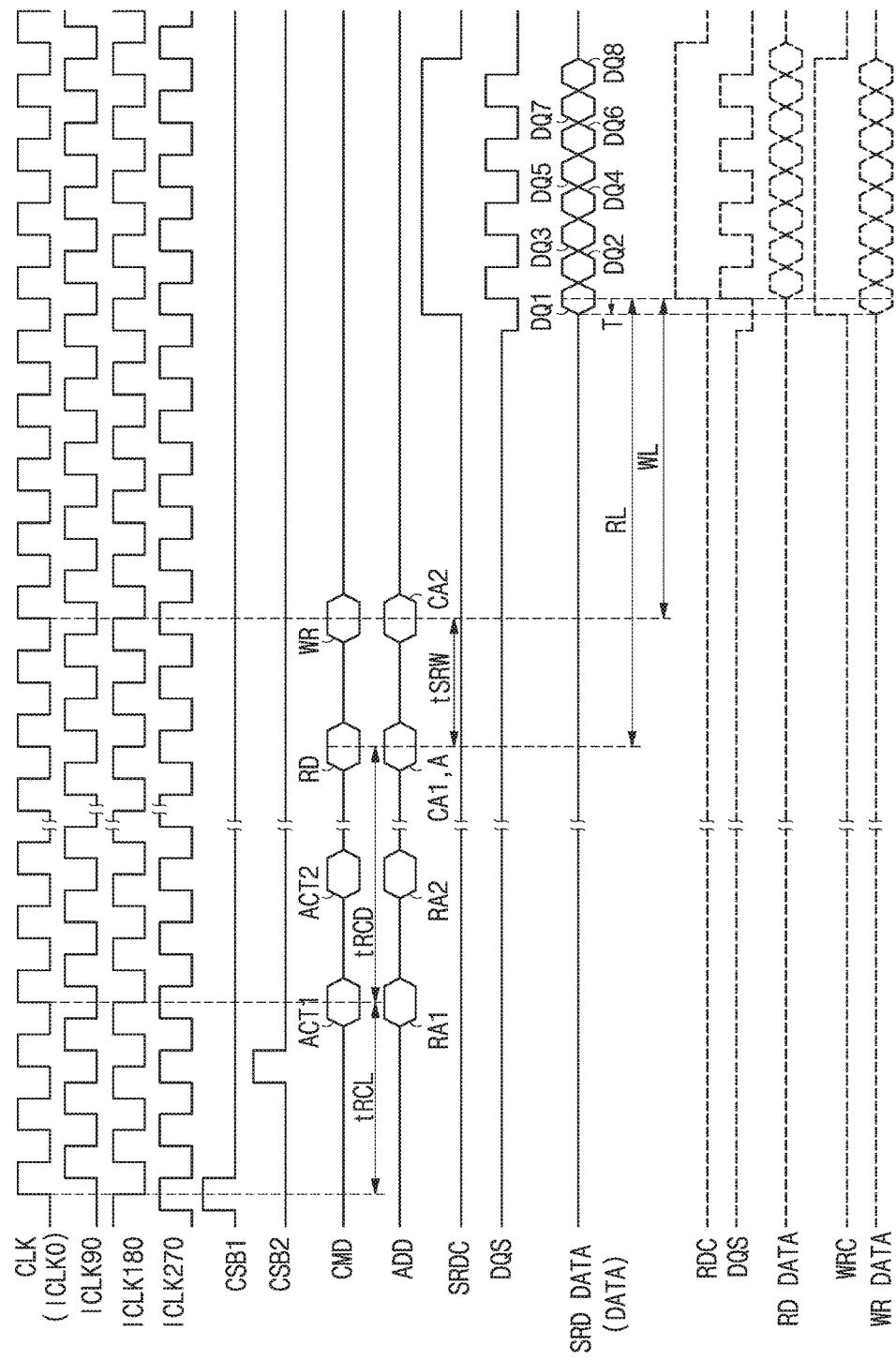

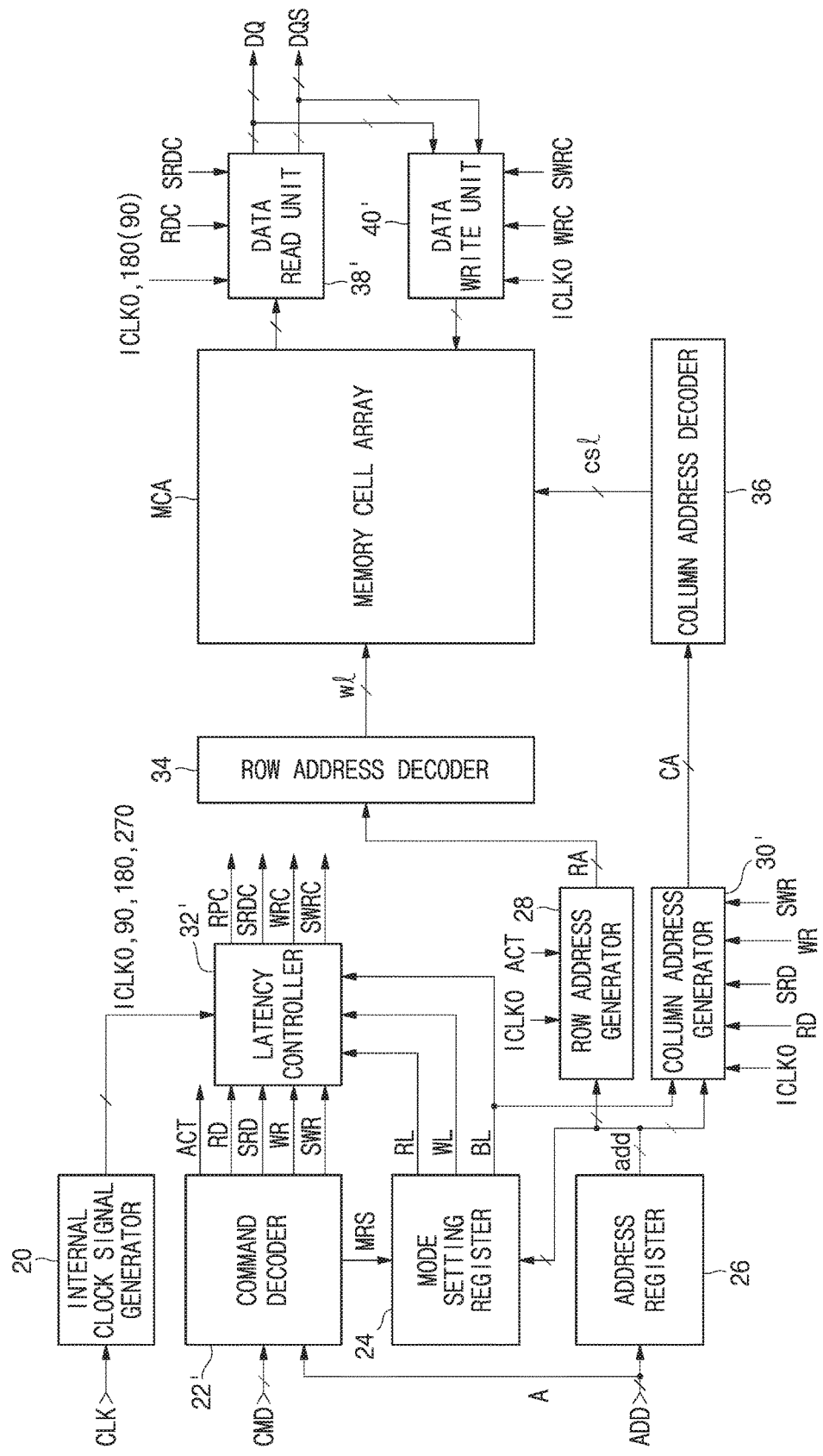

SHIFT READ COMMAND FOR PERFORMING RANK-TO-RANK TRANSFERS IN SEMICONDUCTOR MEMORY DEVICES

CROSS-REFERENCE TO RELATED APPLICATION

This application claims priority under 35 U.S.C. § 119 to Korean Patent Application No. 10-2017-0106776, filed on Aug. 23, 2017, with the Korean Intellectual Property Office (KIPO), the disclosure of which is incorporated herein by reference in its entirety.

BACKGROUND

1. Field

Example embodiments of inventive concepts relate to a memory system, a memory module and/or a semiconductor memory device for the same.

2. Discussion of Related Art

An electronic device may include a controller, a first rank including a plurality of first memory devices, and a second rank including a plurality of second memory devices on a system board. The first rank and the second rank may receive a command/address through the same command/address lines, and transceive data through the same data lines.

When performing a data movement operation of moving data stored in the first rank to the second rank, the controller applies a normal read command to the first rank through the command/address lines, receives and stores data read from the first rank through the data lines, applies a normal write command to the second rank through the command/address lines, and transmits the stored data to the second rank through the data lines. Accordingly, when the controller performs the data movement operation, a time for the data movement operation may be relatively large since the data read from the first rank is transmitted to the second rank through the controller.

SUMMARY

Example embodiments of inventive concepts provide a memory system capable of reducing a time used for performing a data movement operation of moving data between a first rank and a second rank, a memory module and/or a semiconductor memory device for the same.

Example embodiments of the inventive concepts are not limited thereto. Additional example embodiments will be set forth in part in the description which follows and, in part, will be apparent from the description, or may be learned by practice of the presented example embodiments.

According to some example embodiment of inventive concepts, a memory system includes: a controller; a first rank including a plurality of first semiconductor memory devices; a second rank including a plurality of second semiconductor memory devices; command/address signal lines shared by the controller, the first rank, and the second rank; and data lines shared by the controller, the first rank, and the second rank, wherein when performing a data movement operation of moving data between the first rank and the second rank, the controller is configured to, (i) apply a shift read command to one of the first rank and the second rank through the command/address signal lines, and (ii) apply a normal write command or a shift write command to another of the first rank and the second rank through the command/address signal lines after a time corresponding to a value obtained by subtracting a value of a write latency from a value of a read latency, and for a number of clock cycles corresponding to a value of a burst length, data from one of the first rank and the second rank is written to another of the first rank and the second rank through the data lines.

According to some example embodiment of inventive concepts, a memory module may include a rank including a plurality of semiconductor memory devices, wherein values of a read latency, a write latency, and a burst length are set for the rank, and when a normal read command is input, the rank is configured to perform a normal read operation to output data for a number of clock cycles corresponding to a value of the burst length such that the data is aligned to an edge of a data strobe signal from a time which is delayed by a number of clock cycles corresponding to a value of the read latency, when a shift read command is input, the rank is configured to perform a shift read operation to output the data for the number of clock cycles corresponding to the value of the burst length such that the data is aligned to a center of the data strobe signal from a time which is preceded or delayed by the number of clock cycles corresponding to the value of the read latency or a time which is preceded or delayed by a first delay time, the first delay time being one half of a time to output one-bit data, and when a normal write command is input, the rank is configured to perform a normal write operation to input the data for the number of clock cycles corresponding to the value of the burst length such that the data is aligned to a center of a data strobe signal from a time which is preceded by the first delay time.

According to some example embodiment of inventive concepts, a semiconductor memory device may include a memory cell array including a plurality of memory cells selected by a row address signal and a column address signal input from the outside; a command decoder configured to decode a command signal and generate one or more of a mode setting command, a normal read command, a shift read command, and a normal write command; and a mode setting register configured to store values of a read latency, a write latency, and a burst length in response to the mode setting command, wherein when the normal read command is input, the semiconductor memory device is configured to perform a normal read operation to output data for a number of clock cycles corresponding to the value of the burst length such that the data is aligned to an edge of a data strobe signal from a time which is delayed by the number of clock cycles corresponding to the value of the read latency, when the shift read command is input, the semiconductor memory device is configured to perform a shift read operation to output the data for the number of clock cycles corresponding to the value of the burst length output such that the data is aligned to a center of the data strobe signal from the time which is preceded or delayed by the number of clock cycles corresponding to the value of the read latency or a time which is preceded or delayed by a first delay time, the first delay time being half a time to output one-bit data, and when the normal write command is input, the semiconductor memory device is configured to perform a normal write operation to write data for the number of clock cycles corresponding to the value of the burst length such that the data is aligned to the center of a data strobe signal from a time preceded by the first delay time.

According to some example embodiment of inventive concepts, a semiconductor memory device may include an inverted chip selection signal terminal configured to receive an inverted chip selection signal; an inverted active signal terminal configured to receive an inverted active signal; an inverted row address strobe signal/address signal terminal configured to receive an inverted row address strobe signal/address signal; an inverted column address strobe signal/address signal terminal configured to receive an inverted column address strobe signal/address signal; an inverted write enable signal/address signal terminal configured to receive an inverted write enable signal/address signal; an address signal/auto precharge mode signal terminal configured to receive an address signal/auto precharge mode signal; an address signal/burst chop mode signal terminal configured to receive an address signal/burst chop mode signal; first address signal terminals configured to receive address signals; a second address signal terminal configured to receive an address signal; and a third address signal/shift mode signal terminal configured to receive an address signal/shift mode signal, wherein a command signal is applied through the inverted chip selection signal terminal, the inverted active signal terminal, the inverted row address strobe signal/address signal terminal, the inverted column address strobe signal/address signal terminal, and the inverted write enable signal/address signal terminal, a row address is applied through the inverted row address strobe signal/address signal terminal, the inverted column address strobe signal/address signal terminal, the inverter write enable signal/address signal terminal, the address signal/auto precharge mode signal terminal, the address signal/burst chop mode signal terminal, the first address signal terminals, the second address signal terminal, and the third address signal/shift mode signal terminal, a column address is applied through the first address signal terminals, and a mode setting code is applied through the address signal/auto precharge mode signal terminal, the address signal/burst chop mode signal terminal, the first address signal terminals, the second address signal terminal, and the third address signal/shift mode signal terminal.

BRIEF DESCRIPTION OF THE DRAWINGS

The above and other objects, features and advantages of the example embodiments of the inventive concepts will become more apparent to those of ordinary skill in the art by describing example embodiments thereof in detail with reference to the accompanying drawings, in which:

FIG. 3 is an operational timing diagram for describing a data movement operation of a memory system according to an example embodiment of inventive concepts;

FIG. 4 is a block diagram illustrating a configuration of a semiconductor memory device of a memory system according to an example embodiment of inventive concepts;

DETAILED DESCRIPTION

Hereinafter, a memory system, and a memory module and a semiconductor memory device for the same according to example embodiments of inventive concepts will be described with reference to the accompanying drawings.

Figure 1:
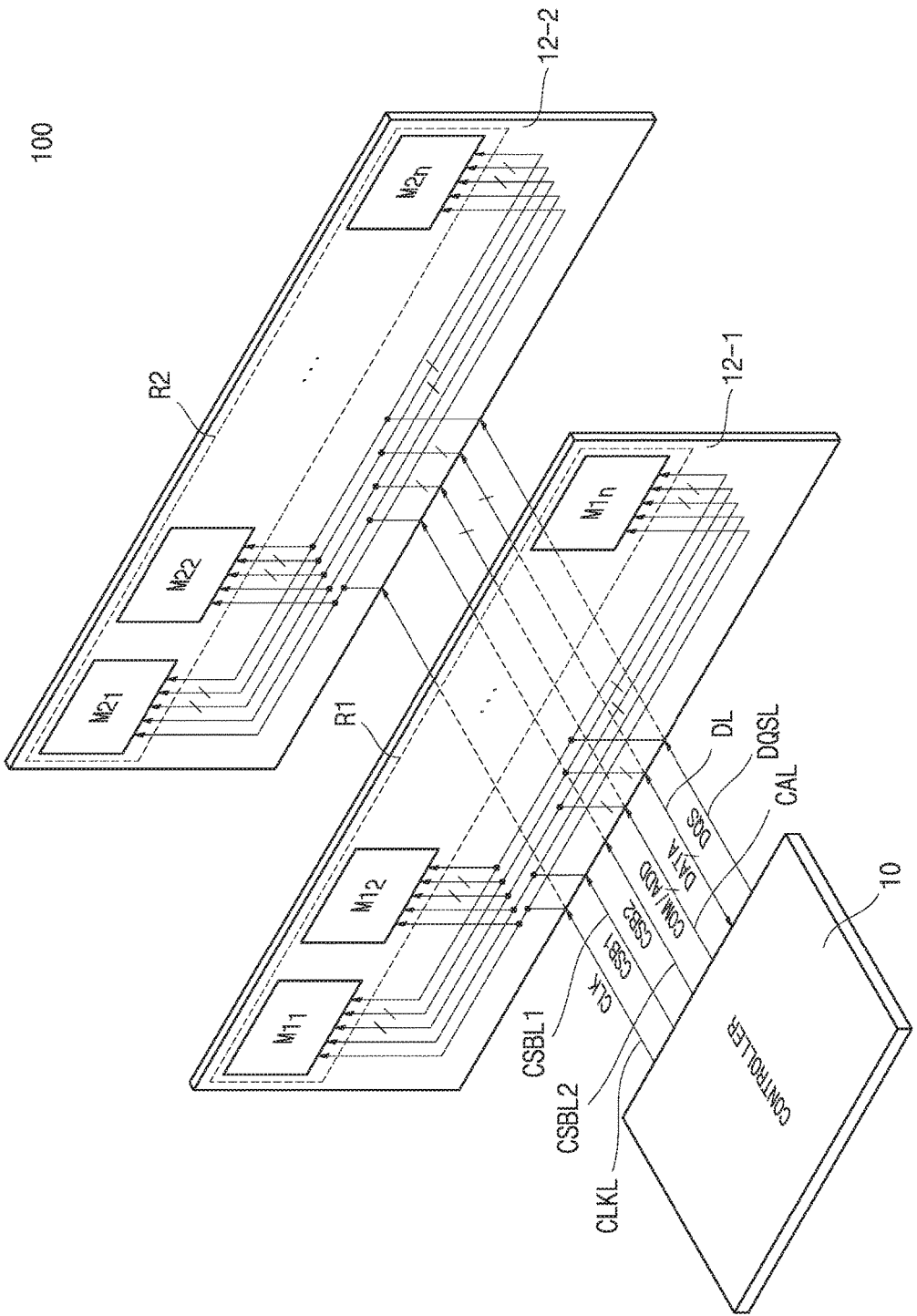
FIG. 1 is a diagram illustrating a memory system according to an example embodiment of inventive concepts.

FIG. 1 is a diagram illustrating a memory system according to an example embodiment of inventive concepts.

Referring to FIG. 1, a memory system 100 may include a controller 10, a first memory module 12-1 including a first rank R1 including n first semiconductor memory devices M11 to M1n, a second memory module 12-2 including a second rank R2 including n second semiconductor memory devices M21 to M2n, a clock signal line CLKL transmitting a clock signal CLK, first and second inverted chip selection signal lines CSBL1 and CSBL2 transmitting first and second inverted chip selection signals CSB1 and CSB2, command/address signal lines CAL transmitting a command/address signal COM/ADD, data lines DL transmitting data DATA, and a data strobe signal line DQSL transmitting a data strobe signal DQS.

The first inverted chip selection signal line CSBL1 transmitting the first inverted chip selection signal CSB1 may be connected between the controller 10 and the first rank R1, and the second inverted chip selection signal line CSBL2 transmitting the second inverted chip selection signal CSB2 may be connected between the controller 10 and the second rank R2. The clock signal line CLKL, the command/address signal lines CAL, the data lines DL, and the data strobe signal line DQSL may be lines shared by the controller 10, the first rank R1, and the second rank R2.

In FIG. 1, an example in which the first rank R1 and the second rank R2 are installed in different memory modules 12-1 and 12-2 is illustrated, but the first rank R1 and the second rank R2 may be installed in the same memory module.

The controller 10 may be a memory controller included in a central processing unit (CPU), or a memory controller which is located outside the CPU.

The controller 10 may be configured to execute commands for writing data or reading data stored in a memory (for example, one of the first memory modules 12-1, and the second memory modules 12-2 or an external memory (not shown) associated with the controller 10 to perform a data movement operation of moving the data between a first rank and a second rank without passing the data through the controller 10).

Each of the clock signal CLK and the data strobe signal DQS may be a differential signal pair transmitted together with an inverted clock signal (not shown) and an inverted data strobe signal (not shown). When each of the first semiconductor memory devices M11 to M1n and each of the second semiconductor memory devices M21 to M2n input and output 8-bit data, a total number of the data lines DL may be 8n.

Figure 2:
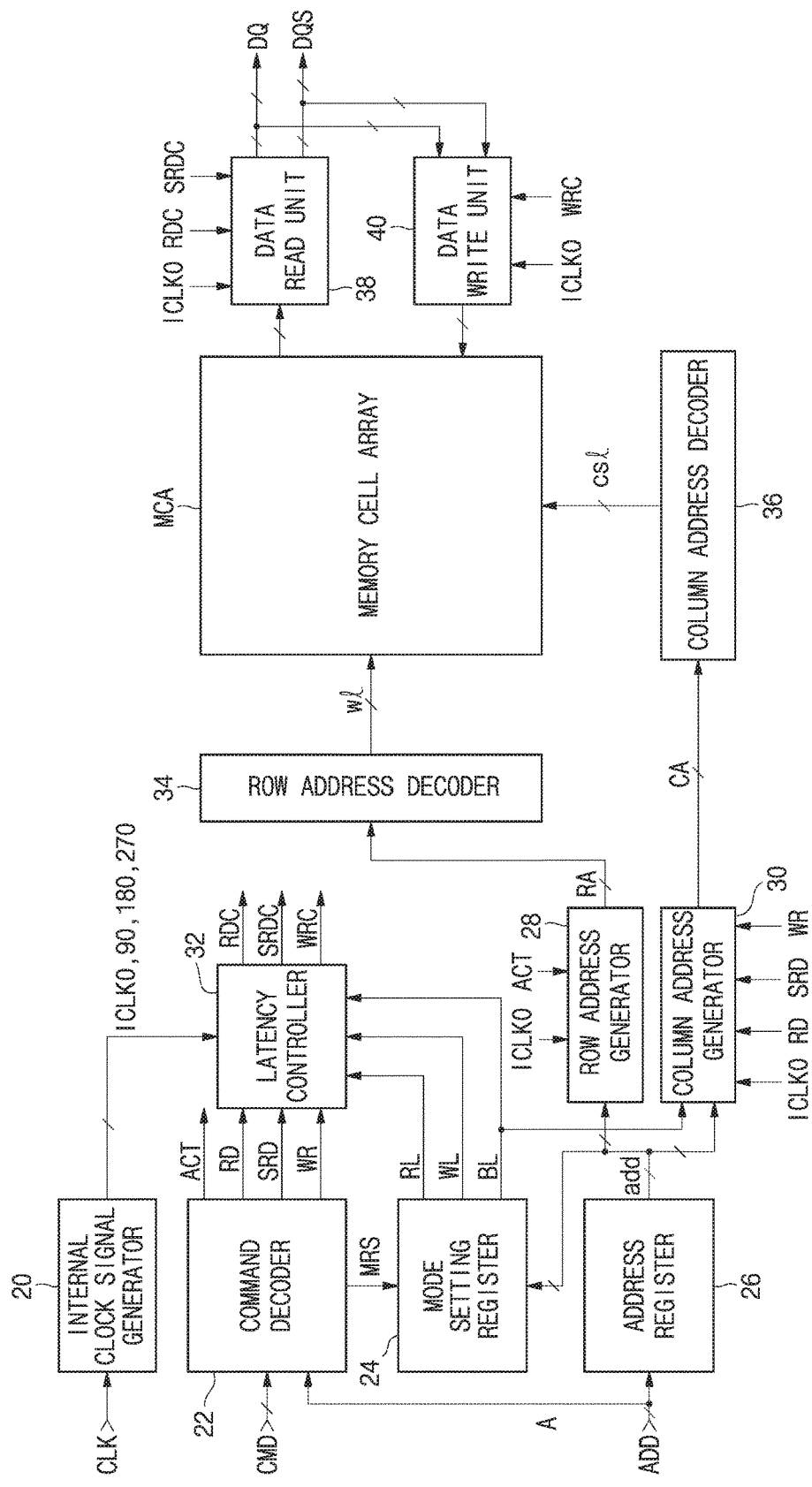
FIG. 2 is a block diagram illustrating a configuration of a semiconductor memory device of a memory system according to an example embodiment of inventive concepts.

FIG. 2 is a block diagram illustrating a configuration of each of the semiconductor memory devices M11 to M1n and M21 to M2n of the memory system 100 according to an example embodiment of inventive concepts.

Referring to FIG. 2, each of the semiconductor memory devices M11 to M1n and M21 to M2n may include an internal clock signal generator 20, a command decoder 22, a mode setting register 24, an address register 26, a row address generator 28, a column address generator 30, a latency controller 32, a row address decoder 34, a column address decoder 36, a memory cell array MCA, a data read unit 38, and a data write unit 40.

A function of each of the blocks shown in FIG. 2 will be described as follows.

The internal clock signal generator 20 may include a delay-locked loop (not shown), the internal clock signal generator 20 may receive the clock signal CLK, and generate an internal clock signal ICLK0 locked to the clock signal CLK, and internal clock signals ICLK90, ICLK180, and ICLK270 which are delayed and locked by 90, 180, and 270 degrees from the clock signal CLK.

The command decoder 22 may receive and decode a command signal CMD, and generate an active command ACT, a normal read command RD, a shift read command SRD, a normal write command WR, and a mode setting command MRS. The command decoder 22 may generate the shift read command SRD when a shift mode signal A input together with the normal read command RD is in a first state (for example, a "high" level or a "low" level). The shift mode signal A may be input through a terminal which is not used to input a column address signal of the semiconductor memory device.

The mode setting register 24 may set values of a read latency (RL), a write latency (WL), and a burst length (BL) using an internal address signal add (in this case, the internal address signal add may be a mode setting code) output from the address register 26 in response to the mode setting command MRS.

The address register 26 may receive and store an address signal ADD, and generate the internal address signal add.

The row address generator 28 may receive the internal address signal add in response to the active command ACT, and generate a row address RA in response to the internal clock signal ICLK0.

The column address generator 30 may receive the internal address signal add in response to the normal read command RD, the shift read command SRD, or the normal write command WR, sequentially count the internal address signal add by the number corresponding to the value of the burst length BL in response to the internal clock signal ICLK0, and generate a column address CA.

The latency controller 32 may generate a normal read control signal RDC which is delayed and activated by the number of clock cycles corresponding to the value of the read latency RL in response to the internal clock signal ICLK0 and delayed and deactivated by the number of clock cycles corresponding to the value of the burst length BL, when the normal read command RD is generated. The clock cycle may be determined based on the clock signal CLK. The latency controller 32 may generate a shift read control signal SRDC which is delayed and activated by a time obtained by subtracting a first desired (or, alternatively, predetermined) delay time ((an output time of one-bit data)/2, that is, the number of the clock cycles corresponding to 1/(the number of data transmitted within one clock cycle×2) from the number of the clock cycles corresponding to the value of the read latency RL in response to the internal clock signal ICLK270 and delayed and deactivated by the number of the clock cycles corresponding to the value of the burst length BL, when the shift read command SRD is generated. The latency controller 32 may generate a normal write control signal WRC which is delayed and activated by a time obtained by subtracting the first desired (or, alternatively, predetermined) delay time from the number of the clock cycles corresponding to the value of the write latency WL in response to the internal clock signal ICLK270 and delayed and deactivated by the number of the clock cycles corresponding to the value of the burst length BL, when the normal write command WR is input.

The row address decoder 34 may decode the row address RA, and generate a word line selection signal wl.

The column address decoder 36 may decode the column address CA, and generate a column selection signal csl for selecting bit lines.

The memory cell array MCA may include a plurality of memory cells (not shown), read data from the memory cells selected by the word line selection signal wl and the column selection signal csl when the normal read command RD or the shift read command SRD is generated, and write data to the selected memory cells when the normal write command WR is generated. The plurality of memory cells (not shown) of the memory cell array MCA may be selected by an address signal ADD input from the outside.

The data read unit 38 may input data read from the selected memory cells, and sequentially output the data to be aligned to an edge of the data strobe signal DQS generated in response to the internal clock signal ICLK0 during an activation period of the normal read control signal RDC, or sequentially output the data to be aligned to a center of the data strobe signal DQS generated by being locked to the internal clock signal ICLK0 during an activation period of the shift read control signal SRDC. When the normal read command RD is generated, the data strobe signal DQS may be edge-aligned with the data based on Joint Electron Device Engineering Council (JEDEC) standards.

The data write unit 40 may sequentially input data DQ input from the outside to be aligned to a center of a data strobe signal DQS during an activation period of the normal write control signal WRC, and output the data DQ to the selected memory cells in response to the internal clock signal ICLK0. When the normal write command WR is generated, the data strobe signal DQS may be center-aligned with the data based on the JEDEC standards.

The semiconductor memory device shown in FIG. 2 is merely a configuration of some example embodiments of inventive concepts, each of the first semiconductor memory devices M11 to M1n of the first memory module 12-1 and each of the second semiconductor memory devices M21 to M2n of the second memory module 12-2 of the memory system 100 shown in FIG. 1 may be diversely configured to perform a normal read operation when the normal read command RD is input, output data from a time which is preceded by the first desired (or, alternatively, predetermined) delay time compared with the normal read operation by performing a shift read operation when the shift read command SRD is input, and perform a normal write operation when the normal write command WR is input.

FIG. 3 is an operational timing diagram for describing a data movement operation of the memory system 100 according to an example embodiment of inventive concepts, and for describing an operation when each of the first and second semiconductor memory devices M11 to M1n and M21 to M2n shown in FIG. 1 performs the function of the semiconductor memory device described with reference to FIG. 2.

The operational timing diagram shown in FIG. 3 is illustrated by supposing that the controller 10 of the memory system 100 shown in FIG. 1 performs a data movement operation of moving data stored in first memory cells selected by a first row address RA1 and a first column address CA1 of each of the first semiconductor memory devices M11 to M1n included in the first rank R1 to second memory cells selected by a second row address RA2 and a second column address CA2 of each of the second semiconductor memory devices M21 to M2n included in the second rank R2. Further, the operational timing diagram shown in FIG. 3 is illustrated by supposing that each of the first semiconductor memory devices M11 to M1n and the second semiconductor memory devices M21 to M2n is a double data rate (DDR) synchronous dynamic random access memory (SDRAM) device, and values of the read latency RL, the write latency WL, and the burst length BL of the DDR SDRAM are set to be 7, 5, and 8, respectively.

The controller 10 may transmit the first inverted chip selection signal CSB1 to the first rank R1 in response to the clock signal CLK. The first semiconductor memory devices M11 to M1n included in the first rank R1 may be selected in response to the first inverted chip selection signal CSB1. The controller 10 may transmit the second inverted chip selection signal CSB2 to the second rank R2 in response to the clock signal CLK. The second semiconductor memory devices M21 to M2n included in the second rank R2 may be selected in response to the second inverted chip selection signal CSB2.

The controller 10 may apply the first inverted chip selection signal CSB1, and transmit the first row address RA1 together with a first active command ACT1 to the first semiconductor memory devices M11 to M1n included in the first rank R1 in response to the clock signal CLK after a second desired (or, alternatively, predetermined) delay time (tCAL: a delay time between the inverted chip selection signal and a corresponding active command). The controller 10 may apply the second inverted chip selection signal CSB2, and transmit the second row address RA2 together with a second active command ACT2 to the second semiconductor memory devices M21 to M2n included in the second rank R2 in response to the clock signal CLK after being delayed by the second desired (or, alternatively, predetermined) delay time tCAL.

The controller 10 may apply the first active command ACT1, and transmit both the first column address CA1 and the shift mode signal A in the first state together with the normal read command RD to the first semiconductor memory devices M11 to M1n included in the first rank R1 in response to the clock signal CLK after a third desired (or, alternatively, predetermined) delay time (tRCD: a delay time between the active command and a corresponding read command (the normal read command or the shift read command) or a corresponding write command (the normal write command or the shift write command)). The controller 10 may apply both the normal read command RD and the shift mode signal A in the first state as the shift read command, and each of the first semiconductor memory devices M11 to M1n included in the first rank R1 may generate the shift read command SRD when the shift mode signal A input together with the normal read command RD is in the first state.

The controller 10 may apply the second active command ACT2, and transmit the second column address CA2 together with the normal write command WR to the second semiconductor memory devices M21 to M2n included in the second rank R2 in response to the clock signal CLK after the third desired (or, alternatively, predetermined) delay time. A fourth desired (or, alternatively, predetermined) delay time tSRW which is a time until applying the normal write command WR after applying the normal read command RD and the shift mode signal A in the first state may be set as a time corresponding to a value obtained by subtracting the value of the write latency WL from the value of the read latency RL, and be a time smaller than a fifth desired (or, alternatively, predetermined) delay time (tCCD: an input delay time between column address signals).

When the normal read command RD and the shift mode signal A in the first state are input, each of the first semiconductor memory devices M11 to M1n included in the first rank R1 may sequentially output data DQ1 to DQ8 to be aligned to the center of the data strobe signal DQS generated in response to the internal clock signal ICLK0 during an activation period of the shift read control signal SRDC which is delayed and activated by a time obtained by subtracting the first desired (or, alternatively, predetermined) delay time (T: 1/4 clock cycle) from 7 clock cycles corresponding to the value of the read latency RL in response to the internal clock signal ICLK270 and deactivated after 4 clock cycles corresponding to 8 which is the value of the burst length BL. That is, data SRD DATA shown in FIG. 3 may be output as the data DATA. On the other hand, each of the first semiconductor memory devices M11 to M1n included in the first rank R1 may sequentially output the data DQ1 to DQ8 to be aligned to the edge of the data strobe signal DQS generated in response to the internal clock signal ICLK0 during an activation period of the normal read control signal RDC which is delayed and activated by 7 clock cycles corresponding to the value of the read latency RL in response to the internal clock signal ICLK0 and deactivated after 4 clock cycles corresponding to 8 which is the value of the burst length BL, when the normal read command RD is input. That is, data RD DATA shown as a dotted line in FIG. 3 may be output. Accordingly, the data SRD DATA in the shift read operation may be output at a time which is preceded by the first desired (or, alternatively, predetermined) delay time T compared with the data RD DATA in the normal read operation.

When the normal write command WR is input, each of the second semiconductor memory devices M21 to M2n included in the second rank R2 may input the data DQ1 to DQ8 which are sequentially input to be aligned to the center of the data strobe signal DQS transmitted from each of the first semiconductor memory devices M11 to M1n during an activation period of the normal write control signal WRC which is delayed and activated by a time obtained by subtracting the first desired (or alternatively, predetermined) delay time T from 5 clock cycles corresponding to the value of the write latency WL in response to the internal clock signal ICLK270 and deactivated after 4 clock cycles corresponding to the value of the burst length BL. That is, data WR DATA shown as the dotted line in FIG. 3 may be input. Accordingly, the data DATA shown in FIG. 3 may be input as the data WR DATA.

FIG. 4 is a block diagram illustrating a configuration of each of the semiconductor memory devices M11 to M1n and M21 to M2n of the memory system 100 according to an example embodiment of inventive concepts.

Referring to FIG. 4, blocks excluding a command decoder 22', a latency controller 32', a column address generator 30', a data read unit 38', and a data write unit 40' of the semiconductor memory device shown in FIG. 4 may have the same configuration as those of the semiconductor memory device shown in FIG. 2. Accordingly, here, only functions of different blocks will be described.

The command decoder 22' may perform the same function as the command decoder 22 shown in FIG. 2, and further generate a shift write command SWR when the shift mode signal A input together with the normal write command WR is in the first state. As described with reference to FIG. 2, the shift mode signal A may be input through a terminal which is not used to input the column address signal of the semiconductor memory device.

The column address generator 30' may receive the internal address signal add in response to the normal read command RD, the shift read command SRD, the normal write command WR, or the shift write command SWR, sequentially count the internal address signal add by the number corresponding to the value of the burst length BL in response to the internal clock signal ICLK0, and generate the column address CA.

As an example embodiment, the latency controller 32' may generate the normal read control signal RDC and the normal write control signal WRC like the latency controller 32 described with reference to FIG. 2 when the normal read command RD and the normal write command WR are generated. On the other hand, when the shift read command SRD is generated unlike the latency controller 32 shown in FIG. 2, the latency controller 32' may generate the shift read control signal SRDC which is delayed and activated by a time obtained by adding the first desired (or alternatively, predetermined) delay time to the number of clock cycles corresponding to the value of the read latency RL in response to the internal clock signal ICLK90 and deactivated after the number of clock cycles corresponding to the value of the burst length BL. Further, when the shift write command SWR is generated, the latency controller 32' may generate a shift write control signal SWRC which is delayed and activated by a time obtained by adding the first desired (or alternatively, predetermined) delay time to the number of clock cycles corresponding to the value of the write latency WL (that is, a sixth desired (or alternatively, predetermined) delay time compared with a case in which the normal write command WR is input) in response to the internal clock signal ICLK90 and deactivated after the number of clock cycles corresponding to the value of the write latency WL. As another example embodiment, when the normal read command RD and the normal write command WR are generated, the latency controller 32' may generate the normal read control signal RDC and the normal write control signal WRC like the latency controller 32 described with reference to FIG. 2. On the other hand, when the shift read command SRD is generated, the latency controller 32' may generate the shift read control signal SRDC which is delayed and activated by the number of clock cycles corresponding to the value of the read latency RL in response to the internal clock signal ICLK0 and deactivated after the number of clock cycles corresponding to the value of the burst length BL like the case in which the normal read command RD is generated. Further, the latency controller 32' may generate the shift write control signal SWRC which is delayed and activated by the number of clock cycles corresponding to the value of the write latency WL in response to the internal clock signal ICLK0 and deactivated after the number of clock cycles corresponding to the value of the burst length BL when the shift write command SWR is generated. The activation periods of the normal read control signal RDC, the shift read control signal SRDC, the normal write control signal WRC, and the shift write control signal SWRC may be generated to have a desired (or alternatively, predetermined) margin before and after the activation periods.

The data read unit 38' may sequentially output the data output from the selected memory cells to be aligned to the edge of the data strobe signal DQS generated in response to the internal clock signal ICLK0 during the activation period of the normal read control signal RDC, or to be aligned to the center of the data strobe signal DQS generated in response to the internal clock signal ICLK180 or the internal clock signal ICLK90 during the activation period of the shift read control signal SRDC different from the activation period of the shift read control signal SRDC described with reference to FIG. 2.

The data write unit 40' may sequentially input the data DQ input from the outside to be aligned to the center of the data strobe signal DQS during the activation period of the normal write control signal WRC, or sequentially input the data DQ input from the outside to be aligned to the center of the data strobe signal DQS during the activation period of the shift write control signal SWRC and output the data input in response to the internal clock signal ICLK0 to the selected memory cells.

The semiconductor memory device shown in FIG. 4 is merely a configuration of an example embodiment of inventive concepts, each of the first semiconductor memory devices M11 to M1n and each of the second semiconductor memory devices M21 to M2n of the memory system 100 shown in FIG. 1 may perform the normal read operation when the normal read command RD is input, perform the shift read operation which outputs the data from a time which is the same as the normal read operation or is delayed by the first desired (or alternatively, predetermined) delay time compared with the normal read operation and outputs the data to be aligned to the center of the data strobe signal DQS unlike the normal read operation when the shift read command SRD is input, perform the normal write operation when the normal write command WR is input, and perform the shift write operation which inputs the data from the time which is delayed by the first desired (or alternatively, predetermined) delay time or the sixth desired (or alternatively, predetermined) delay time compared with the normal write operation when the shift write command SWR is input.

Figure 5A:
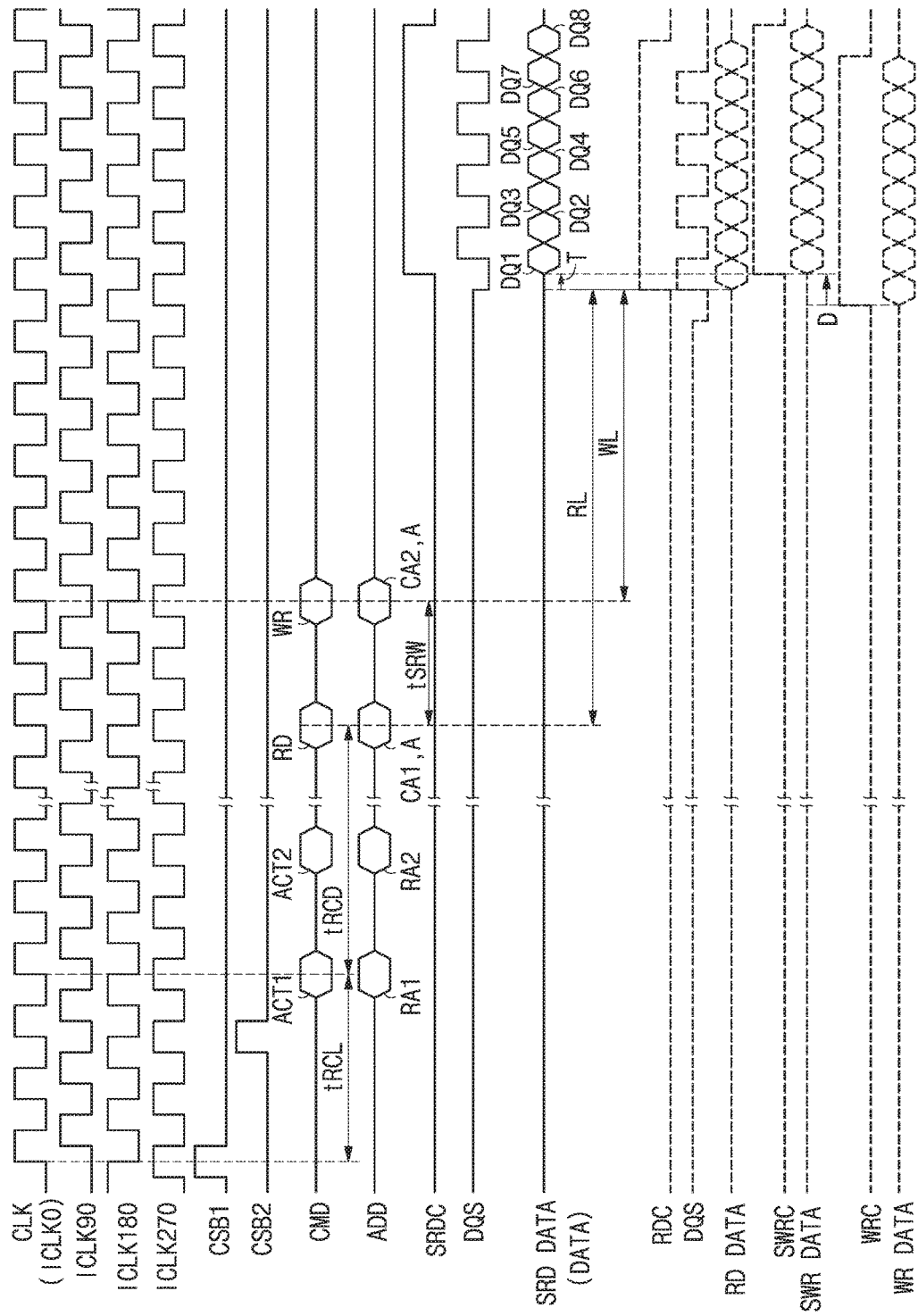
FIGS. 5A and 5B are operational timing diagrams for describing a data movement operation of a memory system according to an example embodiment of inventive concepts.

FIG. 5A is an operational timing diagram for describing a data movement operation of the memory system 100 according to an example embodiment of inventive concepts, and for describing an operation when each of the first and second semiconductor memory devices M11 to M1n and M21 to M2n shown in FIG. 1 performs the function of the semiconductor memory device described with reference to FIG. 4.

The operational timing diagram shown in FIG. 5A is illustrated by applying the same assumption as that described with reference to the operational timing diagram shown in FIG. 3.

In the operational timing diagram shown in FIG. 5A, since an operation performed until the controller 10 applies the first column address CA1 and the shift mode signal A in the first state together with the normal read command RD is the same as that shown in FIG. 3, here, only an operation after applying the normal read command RD will be described.

The controller 10 may apply the second active command ACT2, and transmit the second column address CA2 and the shift mode signal A in the first state together with the normal write command WR to the second semiconductor memory devices M21 to M2n included in the second rank R2 after the third desired (or alternatively, predetermined) delay time in response to the clock signal CLK. The controller 10 may apply the shift mode signal A in the first state together with the normal write command WR as the shift write command, and each of the second semiconductor memory devices M21 to M2n included in the second rank R2 may generate the shift write command SWR when the shift mode signal A input together with the write command WR is in the first state. As described above, the fourth desired (or alternatively, predetermined) delay time tSRW which is between the shift read command SRD and the shift write command SWR may be a time corresponding to a value obtained by subtracting the value of the write latency WL from the value of the read latency RL, and be smaller than the fifth desired (or alternatively, predetermined) delay time tCCD.

When the normal read command RD and the shift mode signal A in the first state are input, each of the first semiconductor memory devices M11 to M1n included in the first rank R1 may sequentially output the data DQ1 to DQ8 to be aligned to the center of the data strobe signal DQS generated in response to the internal clock signal ICLK180 during the activation period of the shift read control signal SRDC which is delayed and activated by a time obtained by adding 7 clock cycles corresponding to the value of the read latency RL and the first desired (or alternatively, predetermined) delay time T and deactivated after 4 clock cycles corresponding to 8 which is the value of the burst length BL in response to the internal clock signal ICLK90. That is, data SRD DATA shown in FIG. 5A may be output as data DATA. On the other hand, when the normal read command RD is input, each of the first semiconductor memory devices M11 to M1n included in the first rank R1 may perform the same operation as that described with reference to FIG. 3, and output the data DQ1 to DQ8. That is, data RD DATA shown in a dotted line in FIG. 5A may be output. Accordingly, the data SRD DATA in the shift read operation may be delayed and output by the first desired (or alternatively, predetermined) delay time T compared with the data RD DATA in the normal read operation.

When the normal write command WR and the shift mode signal A in the first state are input, each of the second semiconductor memory devices M21 to M2n included in the second rank R2 may input data DQ1 to DQ8 which are sequentially input to be aligned to the center of the data strobe signal DQS from each of the first semiconductor memory devices M11 to M1n during the activation period of the shift write control signal SWRC which is delayed and activated by a time obtained by adding the first desired (or alternatively, predetermined) delay time T and 5 clock cycles corresponding to the value of the write latency WL in response to the internal clock signal ICLK90 and deactivated after 4 clock cycles corresponding to 8 which is the value of the burst length BL. That is, data DATA shown in FIG. 5A may be input as data SWR DATA. On the other hand, when the normal write command WR is input, each of the second semiconductor memory devices M21 to M2n included in the second rank R2 may perform the same operation as that described with reference to FIG. 3. That is, data WR DATA shown in the dotted line in FIG. 5A may be input. Accordingly, the data SWR DATA in the shift write operation may be delayed and input by the sixth desired (or alternatively, predetermined) delay time D compared with the data WR DATA in the normal write operation.

Figure 5B:
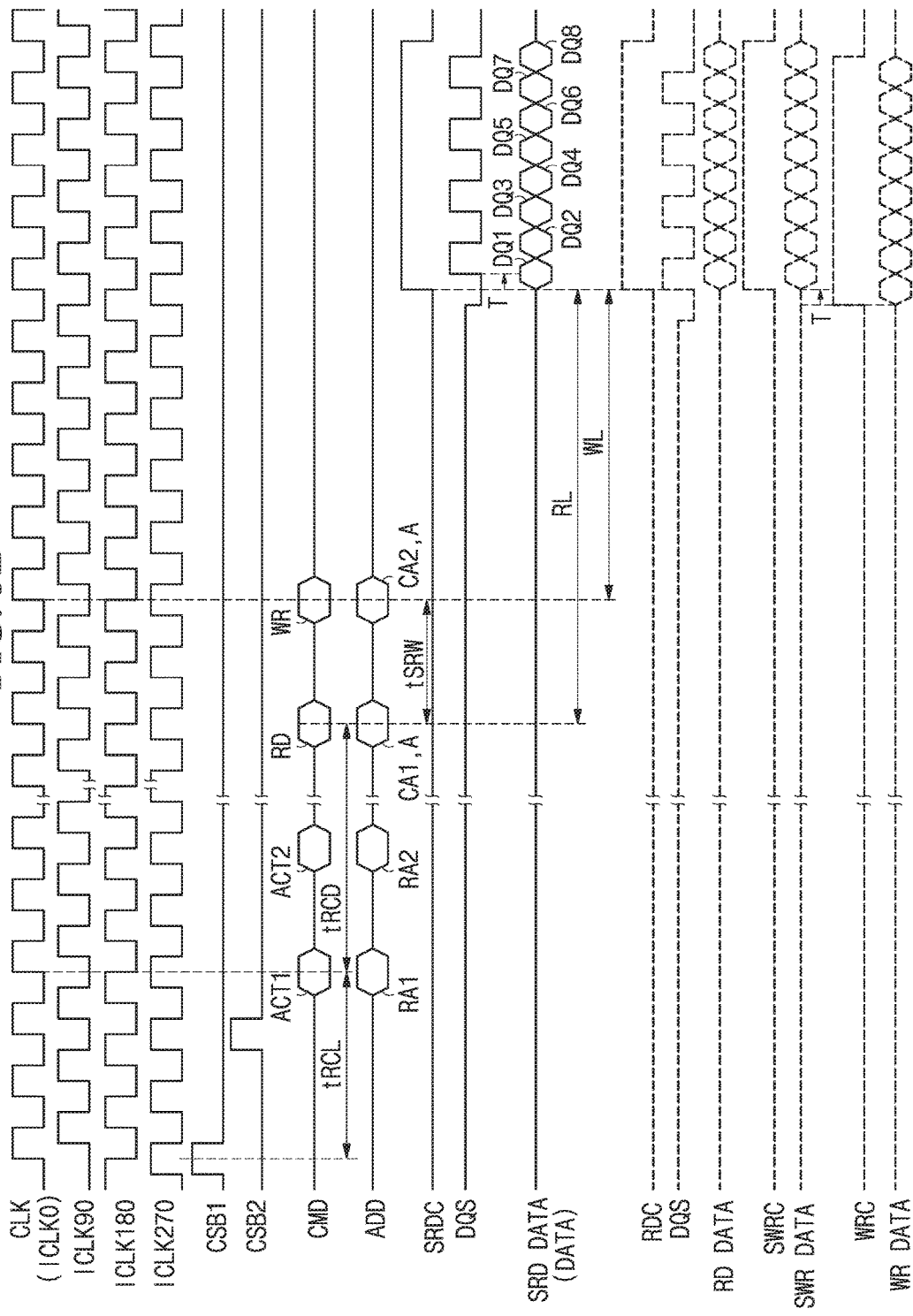

FIG. 5B is an operational timing diagram for describing a data movement operation of the memory system 100 according to an example embodiment of inventive concepts, and for describing an operation in which each of the first and second semiconductor memory devices M11 to M1n and M21 to M2n shown in FIG. 1 performs the function of the semiconductor memory device described with reference to FIG. 4.

The operational timing diagram shown in FIG. 5B is illustrated by applying the same assumption as that described with reference to the operational timing diagram shown in FIG. 3.

In the operational timing diagram shown in FIG. 5B, since an operation performed until the controller 10 applies the second column address CA2 and the shift mode signal A in the first state together with the normal write command WR is the same as that shown in FIG. 5A, here, a description regarding the operation will be omitted.

When the normal read command RD and the shift mode signal A in the first state are input, each of the first semiconductor memory devices M11 to M1n included in the first rank R1 may sequentially output the data DQ1 to DQ8 to be aligned to the center of the data strobe signal DQS generated in response to the internal clock signal ICLK90 during the activation period of the shift read control signal SRDC which is delayed and activated by 7 clock cycles corresponding to the value of the read latency RL in response to the internal clock signal ICLK0 and is deactivated after 4 clock cycles corresponding to 8 which is the value of the burst length BL. That is, data SRD DATA shown in FIG. 5B may be output as data DATA. On the other hand, when the normal read command RD is input, each of the first semiconductor memory devices M11 to M1n included in the first rank R1 may output the data DQ1 to DQ8 by performing the same operation as that described with reference to FIG. 3. That is, data RD DATA shown in the dotted line in FIG. 5B may be output. Accordingly, the data SRD DATA in the shift read operation may be output at a time which is the same as the data RD DATA in the normal read operation, and output to be aligned to the center of the data strobe signal DQS unlike the data RD DATA output to be aligned to the edge of the data strobe signal DQS in the normal read operation.

When the normal write command WR and the shift mode signal A in the first state are input, each of the second semiconductor memory devices M21 to M2n included in the second rank R2 may input the data DQ1 to DQ8 which are sequentially input to be aligned to the center of the data strobe signal DQS from each of the first semiconductor memory devices M11 to M1n during the activation period of the shift write control signal SWRC which is delayed and activated by 5 clock cycles corresponding to the value of the write latency WL in response to the internal clock signal ICLK0 and deactivated after 4 clock cycles corresponding to 8 which is the value of the burst length BL. That is, the data DATA shown in FIG. 5B may be input as data SWR DATA. On the other hand, when the normal write command WR is input, each of the second semiconductor memory devices M21 to M2n included in the second rank R2 may input the data DQ1 to DQ8 by performing the same operation as that described with reference to FIG. 3. That is, data WR DATA shown in the dotted line in FIG. 5B may be input. Accordingly, the data SWR DATA in the shift write operation may be delayed and input by the first desired (or alternatively, predetermined) delay time T compared with the data WR DATA in the normal write operation.

Although not shown, external terminals (balls or pins) of the semiconductor memory device described with reference to FIGS. 2 and 4 may include external terminals of a DDR SDRAM standardized by Joint Electron Device Engineering Council (JEDEC).

In the semiconductor memory device according to example embodiments of inventive concepts described above with reference to FIGS. 2 and 4, a command signal may be input through an inverted active signal ACTB terminal, an inverted chip selection signal CSB terminal, an inverted row address strobe signal/address signal RASB/A16 terminal, an inverted column address strobe signal/address signal CASB/A15 terminal, and an inverted write enable signal/address signal WEB/A14 terminal. A row address signal may be input through the inverted row address strobe signal/address signal RASB/A16 terminal, the inverted column address strobe signal/address signal CASB/A15 terminal, the inverted write enable signal/address signal WEB/A14 terminal, an address signal/shift mode signal A17/A terminal, address signal A13, A11, and A0~A9 terminals, an address signal/burst chop mode signal A12/BCB terminal, and an address signal/auto precharge signal A10/AP terminal. A mode setting code may be input through the address signal/shift mode signal A17/A terminal, the address signal A13, A11, and A0·A9 terminals, the address signal/burst chop mode signal A12/BCB terminal, and the address signal/auto precharge signal A10/AP terminal. An auto precharge mode signal AP may be input through the address signal/auto precharge mode A12/AP terminal, and a burst chop mode signal BCB may be input through the address signal/burst chop mode signal A12/BCB terminal. The shift mode signal A may be input through the address signal/shift mode signal A17/A. The shift mode signal A may be input through the address signal A13 terminal unlike Table 1 shown below. That is, the shift mode signal A may be input through one among the address signal terminals which are used to input the mode setting code or the row address signal but are not used to input the column address signal.

The command decoder 22 may generate the mode setting command MRS when all of the inverted chip selection signal CSB, the inverted active signal ACTB, the inverted row address strobe signal RASB, the inverted column address strobe signal CASB, the inverted write enable signal WEB, and the shift mode signal A are the "low" level.

Referring to Table 1 and the semiconductor memory device shown in FIG. 4, the command decoder 22' may further generate the shift write command SWR when the inverted chip selection signal CSB, the inverted active signal ACTB, the inverted row address strobe signal RASB, the inverted column address strobe signal CASB, the inverted write enable signal WEB, and the shift mode signal A are the "low" level, the "high" level, the "high" level, the "low" level, the "low" level, and the "high" level, respectively.

Referring to Table 1 and the semiconductor memory device shown in FIG. 2 or 4, when the active command ACT is generated, the address register 26 and the row address generator 28 may input the address signals A16, A15, A14, and A0~A12 input from the outside, and generate the row address RA.

Referring to Table 1 and the semiconductor memory device shown in FIG. 2 or 4, when the normal read com-

TABLE 1

| COM | CSB | ACTB | RASB/ A16 | CASB/ A15 | WEB/ A14 | A17/A | A13 | A12/ BCB | A11 | A10/AP | A0~A9 |
|---|---|---|---|---|---|---|---|---|---|---|---|
| ACT | L | L | | RA | | | | RA | | | |
| RD | L | H | H | L | H | L | V | BCB | CA | AP | CA |
| SRD | L | H | H | L | H | H | V | BCB | CA | AP | CA |
| WR | L | H | H | L | L | L | V | BCB | CA | AP | CA |
| SWR | L | H | H | L | L | H | V | BCB | CA | AP | CA |
| MRS | L | H | L | L | L | | | MODE SETTING CODE | | | |

In Table 1 above, H represents a "high" level (a first state), L represents a "low" level (a second state), V represents a "high" level or a "low" level (however, a defined logic level), RA represents a row address, and CA represents a column address.

Referring to Table 1 and the semiconductor memory device shown in FIG. 2 or 4, the command decoder 22 may generate the active command ACT when the inverted chip selection signal CSB and the inverted active signal ACTB which are input from the outside are the "low" levels. The command decoder 22 may generate the normal read command RD when the inverted chip selection signal CSB, the inverted active signal ACTB, the inverted row address strobe signal RASB, the inverted column address strobe signal CASB, the inverted write enable signal WEB, and the shift mode signal A are the "low" level, the "high" level, the "high" level, the "low" level, the "high" level, and the "low" level, respectively, and generate the normal write command WR when the inverted chip selection signal CSB, the inverted active signal ACTB, the inverted row address strobe signal RASB, the inverted column address strobe signal CASB, the inverted write enable signal WEB, and the shift mode signal A are the "low" level, the "high" level, the "high" level, the "low" level, the "low" level, and the "low" level, respectively. The command decoder 22 may generate the shift read command SRD when the inverted chip selection signal CSB, the inverted active signal ACTB, the inverted row address strobe signal RASB, the inverted column address strobe signal CASB, the inverted write enable signal WEB, and the shift mode signal A are the "low" level, the "high" level, the "high" level, the "low" level, the "high" level, and the "high" level, respectively.

mand RD, the shift read command SRD, and the normal write command WR are generated, the address register 26 and the column address generator 30 may input the address signals A11, A0~A9 input from the outside, and generate the column address CA. Referring to Table 1 and the semiconductor memory device shown in FIG. 4, when the shift write command SWR is generated, the address register 26 and the column address generator 30' may input the address signals A11, A0~A9 input from the outside, and further generate the column address CA.

Referring to Table 1 and the semiconductor memory device shown in FIG. 2 or 4, when the mode setting command MRS is generated, the address register 26 and the mode setting register 24 may input the mode setting code input through the address signal A13 or A17, A12~A0 terminals, and set mode setting values (the values of the read latency RL, the write latency WL, and the burst length BL).

The semiconductor memory device according to example embodiments of inventive concepts may perform the operations described above with reference to FIGS. 2 to 5B described above when the normal read command RD, the shift read command SRD, the normal write command WR, and/or the shift write command SWR and the address signals are input.

Figure 6:
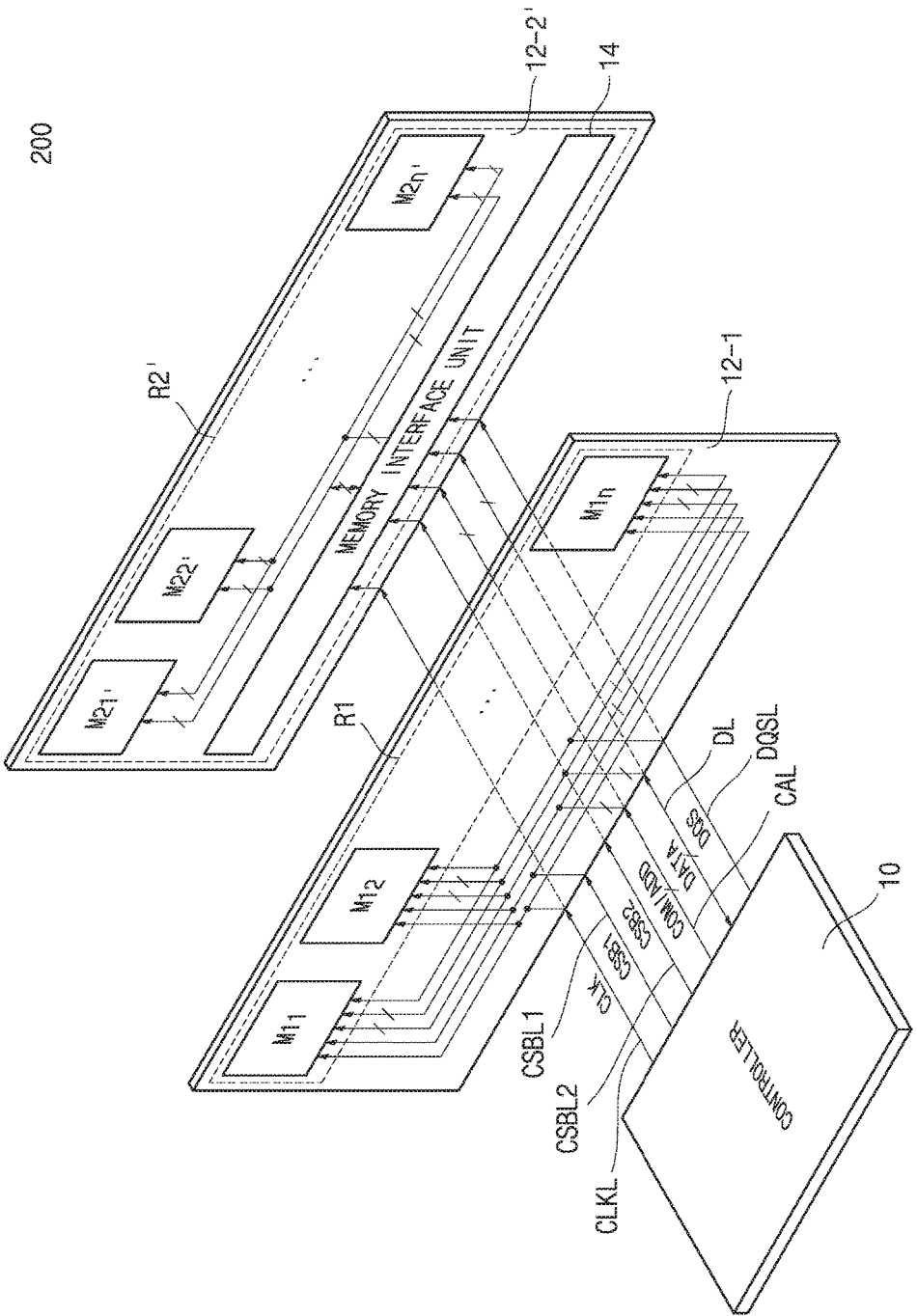
FIG. 6 is a diagram illustrating a memory system according to an example embodiment of inventive concepts.

FIG. 6 is a diagram illustrating a memory system according to an example embodiment of inventive concepts.

A memory system 200 shown in FIG. 6 may have the same configuration as the memory system 100 shown in FIG. 1 except for the configuration including a second memory module 12-2' instead of the second memory module 12-2.

Referring to FIG. 6, the second memory module 12-2' may include a second rank R2' including second memory devices M21' to M2n', and a memory interface unit 14. The controller 10, each of the first semiconductor memory devices M11 to M1n included in the first rank R1, and the memory interface unit 14 included in the second rank R2' may input and output data using a first protocol, and the memory interface unit 14 included in the second rank R2', and each of the second semiconductor memory devices M21' to M2n' may input and output data using a second protocol different from the first protocol. As an example embodiment, each of the first semiconductor memory devices M11 to M1n may be a DDR SDRAM, and each of the second semiconductor memory devices M21' to M2n' may be a non-volatile memory device such as a NAND flash memory device, a magnetoresistive random access (MRAM) device, or a phase-change random access memory (PRAM) device.

When each of the first semiconductor memory devices M11 to M1n is the DDR SDRAM device and each of the second semiconductor memory devices M21' to M2n' is the NVM device, each of the first semiconductor memory devices M11 to M1n may input and output data DATA using a DDR SDRAM protocol, and each of the second semiconductor memory devices M21' to M2n' may input and output the data DATA using a NVM protocol. The controller 10 may input and output the data DATA using the DDR SDRAM protocol with the first semiconductor memory devices M11 to M1n, and the memory interface unit 14. The memory interface unit 14 may convert a command/address and data transmitted through the command/address signal lines CAL and the data lines DL using the DDR SDRAM protocol into a command/address and data using the NVM protocol, transmit the converted command/address and data to each of the second semiconductor memory devices M21' to M2n', convert data output from each of the second semiconductor memory devices M21' to M2n' into data using the DDR SDRAM protocol, and transmit the converted data to the data lines DL.

The memory interface unit 14 may perform the normal read operation when the normal read command RD is input, and perform the shift read operation which outputs the data from a time which is the same as the normal read operation or is preceded or delayed by the first desired (or alternatively, predetermined) delay time compared with the normal read operation when the shift read command SRD is input. The memory interface unit 14 may perform the normal write operation when the normal write command WR is input, and perform the shift write operation which inputs the data from a time which is delayed by the first desired (or alternatively, predetermined) delay time or the sixth desired (or alternatively, predetermined) delay time compared with the normal write operation when the shift write command SWR is input.

Figure 7:
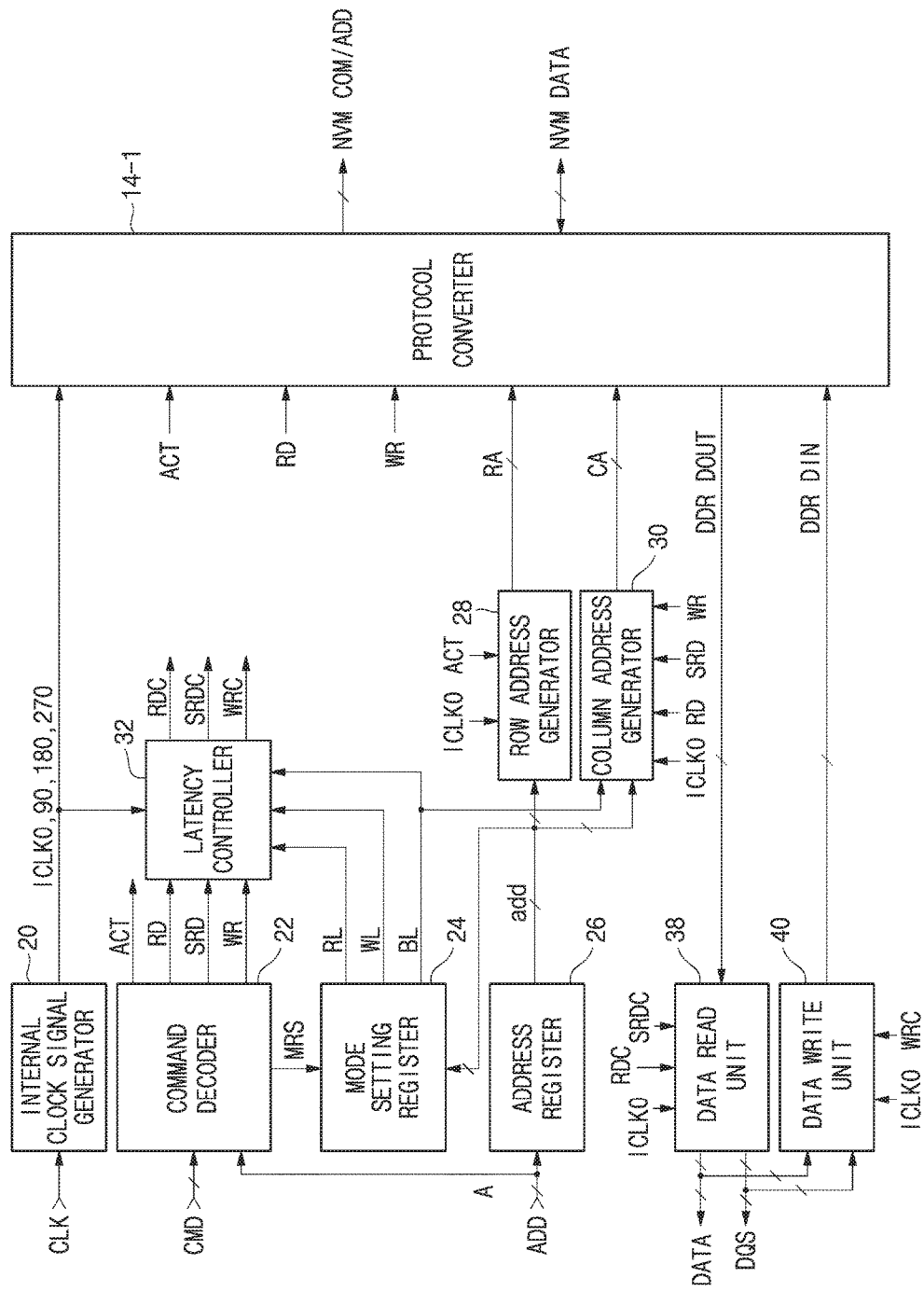
FIG. 7 is a block diagram illustrating a configuration of a memory interface unit according to an example embodiment of inventive concepts.

FIG. 7 is a block diagram illustrating a configuration of the memory interface unit 14 shown in FIG. 6, and the memory interface unit 14 may include the internal clock signal generator 20, the command decoder 22, the mode setting register 24, the address register 26, the row address generator 28, the column address generator 30, the latency controller 32, the data read unit 38, and the data write unit 40, of the semiconductor memory device shown in FIG. 2. Further, the memory interface unit 14 may further include a protocol converter 14-1.

In FIG. 7, the blocks having the same reference numerals as those shown in FIG. 2 may perform the same function as those shown in FIG. 2.

A function of the protocol converter 14-1 will be described below by supposing that the command/address COM/ADD and the data DATA using the DDR SDRAM protocol are applied to the memory interface unit 14 and the command/address NVM COM/ADD and the NVM data NVM DATA using the NVM protocol are output from the memory interface unit 14.

The memory interface unit 14 may output the data from a time which is delayed by the number of clock cycles corresponding to the value of the read latency RL when the normal read command RD is input, output the data from a time which is delayed by a value obtained by subtracting the first desired (or alternatively, predetermined) delay time from the number of clock cycles corresponding to the value of the read latency RL when the shift read command SRD is input, and input the data from a time which is delayed by a value obtained by subtracting the first desired (or alternatively, predetermined) delay time from the number of clock cycles corresponding to the value of the write latency WL when the normal write command WR is input. The protocol converter 14-1 may input the internal clock signal ICLK, the active command ACT, the normal read command RD, the normal write command WR, the row address RA, and the column address CA, convert them into the NVM command/address NVM COM/ADD using the NVM protocol, convert DDR input data DDR DIN into the NVM data NVM DATA to output the NVM data NVM DATA or convert the NVM data NVM DATA into DDR output data DDR DOUT to output the DDR output data DDR DOUT in response to the NVM command/address NVM COM/ADD. Accordingly, the memory system 200 shown in FIG. 6 may perform the data movement operation described with reference to the operational timing diagram shown in FIG. 3 by including the memory interface unit 14 shown in FIG. 7.

As an example embodiment, although not shown, the memory interface unit 14 shown in FIG. 6 may include the internal clock signal generator 20, the command decoder 22', the mode setting register 24, the address register 26, the row address generator 28, the column address generator 30', the latency controller 32', the data read unit 38', and the data write unit 40' of the semiconductor memory device shown in FIG. 4. Further, the memory interface unit 14 may further include the protocol converter 14-1 shown in FIG. 7. Accordingly, the memory system 200 shown in FIG. 6 may perform the data movement operation described with reference to the operational timing diagrams shown in FIGS. 5A and 5B.

Figure 8:
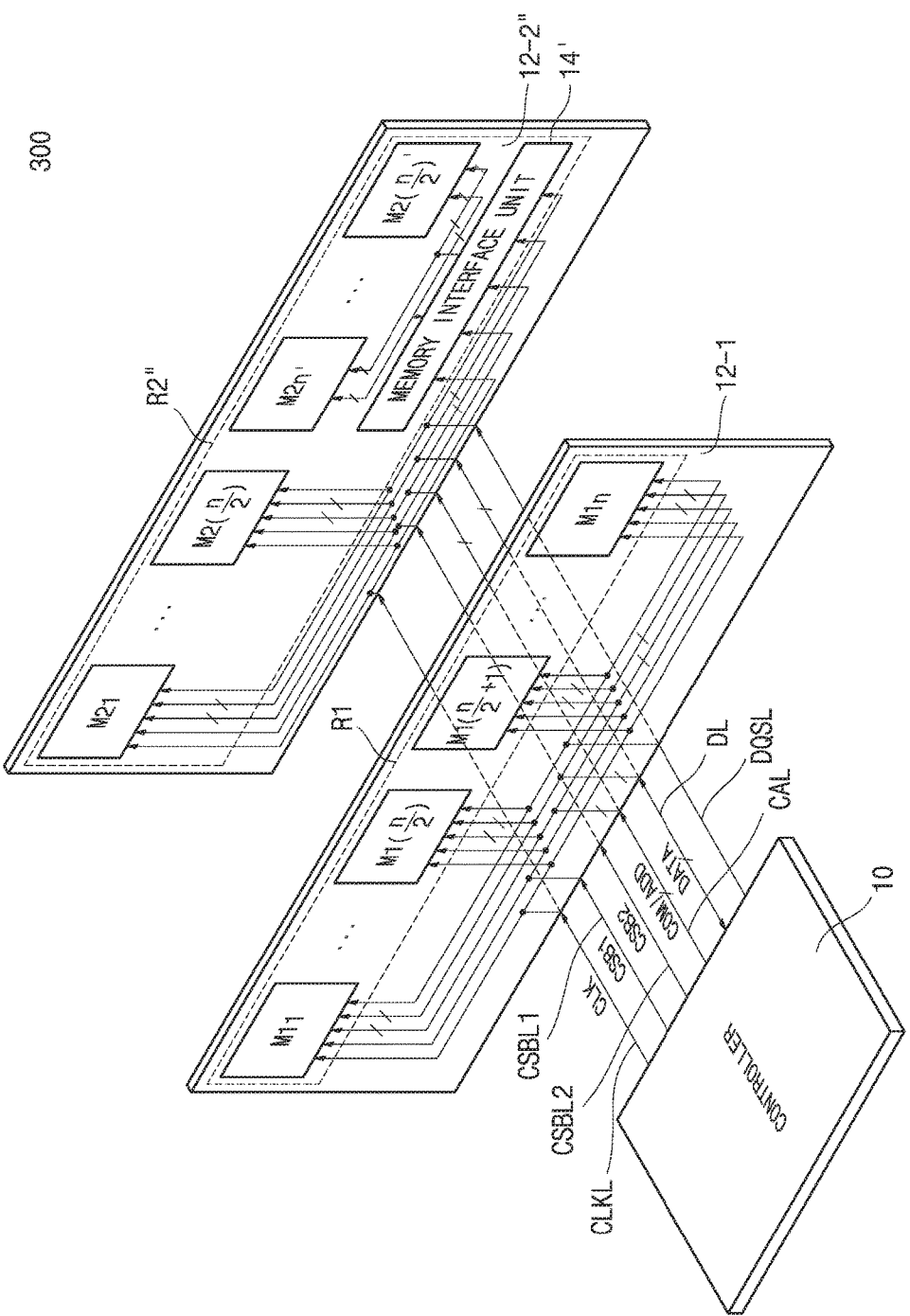
FIG. 8 is a diagram illustrating a memory system according to an example embodiment of inventive concepts.

FIG. 8 is a diagram illustrating a memory system 300 according to an example embodiment of inventive concepts.

The memory system 300 shown in FIG. 8 may have the same configuration as the memory system 100 shown in FIG. 1 except for the configuration including a second memory module 12-2" instead of the second memory module 12-2 of the memory system 100 shown in FIG. 1.

Referring to FIG. 8, the second memory module 12-2" may include a second rank R2" including n/2 second semiconductor memory devices M21 to M2(n/2) of the second rank R2 of the memory system 100 shown in FIG. 1, n/2 second semiconductor memory devices M21' to M2(n/2)' of the second rank R2' of the memory system 200 shown in FIG. 6, and a memory interface unit 14'. The first semiconductor memory devices M11 to M1n included in the first rank R1 and the second semiconductor memory devices M21 to M2(n/2) included in the second rank R2" may input and output data using the same protocol. The first semiconductor memory devices M11 to M1n included in the first rank R1 and the second semiconductor memory devices M21' to M2(n/2)' included in the second rank R2' may input and output the data using protocols different from each other.

As an example embodiment, the first semiconductor memory devices M11 to M1n and the second semiconductor memory devices M21 to M2(n/2) may be DDR SDRAM devices, and the second semiconductor memory devices M21' to M2(n/2)' may be NVM devices such as NAND flash memory devices, MRAM devices, or PRAM devices.

When the first semiconductor memory devices M11 to M1n and the second semiconductor memory devices M21 to M2(n/2) are the DDR SDRAM devices and the second semiconductor memory devices M21' to M2(n/2)' are the NVM devices, each of the first semiconductor memory devices M11 to M1n, each of the second semiconductor memory devices M21 to M2(n/2), and the memory interface unit 14' may input and output the data DATA from/to the controller 10 using the DDR SDRAM protocol, and the memory interface unit 14' and each of the second semiconductor memory devices M21' to M2(n/2)' may input and output the data using the NVM protocol. The memory interface unit 14' may perform the same operation as the memory interface unit 14 described with reference to FIG. 7.

Accordingly, the memory system 300 shown in FIG. 8 may perform the data movement operation described with reference to the operational timing diagrams shown in FIG. 3, or FIGS. 5A and 5B.

In the example embodiments described above, the data movement operation of moving the data stored in the first semiconductor memory devices M11 to M1n included in the first rank R1 of the memory system 100, 200, or 300 to the second semiconductor memory devices M21 to M2n, M21' to M2n', or M21 to M2(n/2) and M21' to M2(n/2)' included in the second rank R2, R2', or R2" was described. However, a data movement operation of moving data stored in the second semiconductor memory devices M21 to M2n, M21' to M2n', or M21 to M2(n/2) and M21' to M2(n/2)' included in the second rank R2, R2', or R2" of the memory system 100, 200, or 300 to the first semiconductor memory devices M11 to M1n included in the first rank R1 may be performed in the same manner.

Figure 9:
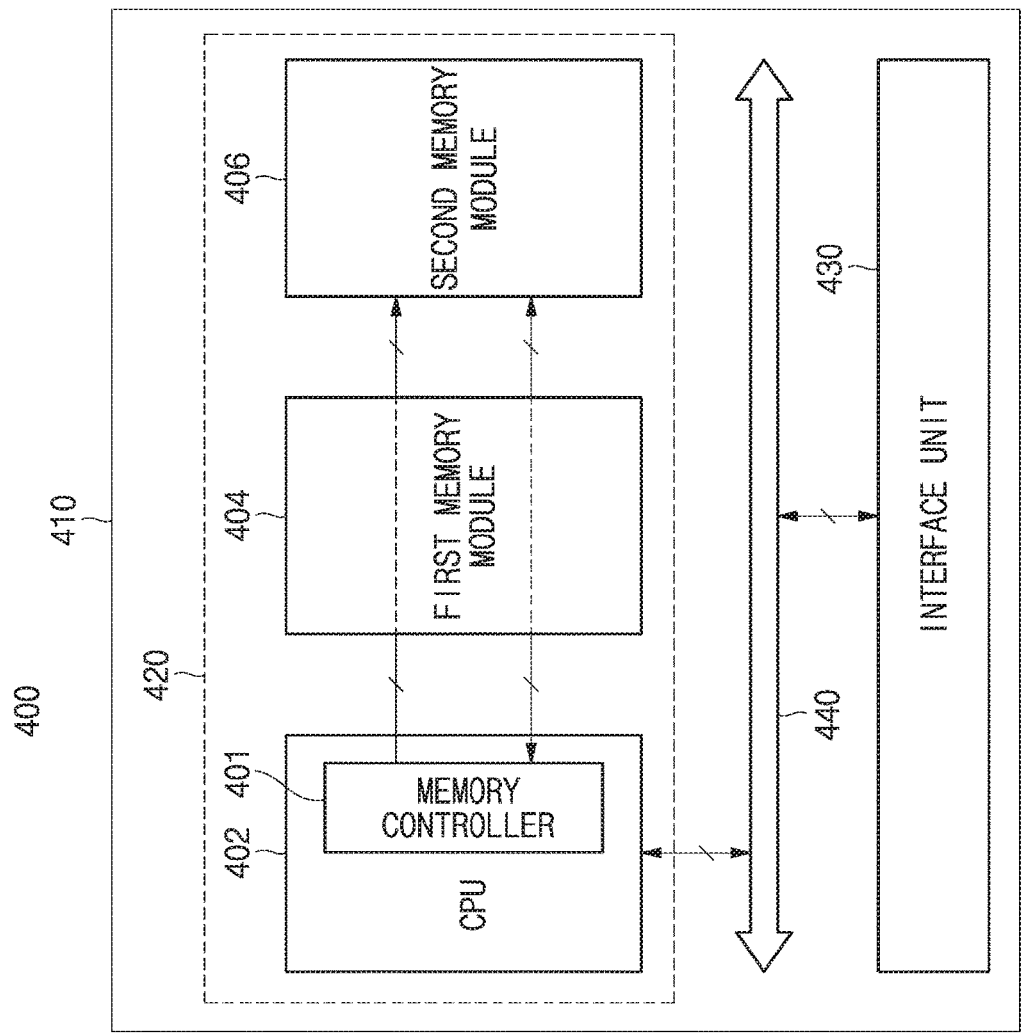
FIG. 9 is a block diagram illustrating an electronic system including a memory system according to an example embodiment of inventive concepts.

FIG. 9 is a block diagram illustrating an electronic system including a memory system according to an example embodiment of inventive concepts.

Referring to FIG. 9, an electronic system 400 may include a body 410. The body 410 may be a system board or a mother board having a printed circuit board. The electronic system 400 may include a memory system 420 including a central processing unit (CPU) 402, a first memory module 404, and a second memory module 406, an interface unit 430, and a bus 440. The CPU 402 may include a memory controller 401 inside.

The CPU 402 may control the electronic system 400. The first memory module 404 may be used as a cache memory of the CPU 402, and the second memory module 406 may be used as a main memory of the CPU 402. The CPU 402, the first memory module 404, and the second memory module 406 may have the configuration shown FIG. 1, 6, or 8. The interface unit 430 may be connected to the bus 440, and perform a function of inputting and outputting data under the control of the CPU 402. The electronic system 400 may be a mobile device or a computer.

The second memory module 406 may have a greater storage capacity than the first memory module 404. The CPU 402 may include an internal cache memory (not shown) for storing frequently requested data and commands. The CPU 402 may store the frequently requested data and commands to the first memory module 404 used as the cache memory when the storage capacity of the internal cache memory (not shown) is insufficient. The CPU 402 may find the frequently requested data and commands in the first memory module 404 when the frequently requested data and commands are not found in the internal cache memory (not shown), and find the frequently requested data and commands in the second memory module 406 used as the main memory when the frequently requested data and commands are not found even in the first memory module 404. When the CPU 402 finds the frequently requested data and commands in the second memory module 406, the CPU 402 may store the data and commands stored in the second memory module 406 in the internal cache memory or the first memory module 404. When the storage capacity of the internal cache memory is insufficient, the CPU 402 may perform the data movement operation of moving the data and commands stored in the second memory module 406 to the first memory module 404 described using the operational timing diagram of FIG. 3, 5A, or 5B.

According to the example embodiments of inventive concepts, when the controller included in the memory system controls the data movement operation of moving the data between the first rank and the second rank, the data movement operation may be performed such that the data does not pass through the controller. For example, the data may be transferred directly between the first rank and the second rank.

According to the example embodiments of the inventive concepts, when the CPU of the electronic system performs the data movement operation of moving the data between the external cache memory and the main memory, the data movement operation may be performed not through the CPU.

According to the example embodiments of the inventive concepts, since the time used for performing the data movement operation is reduced, operation performance of the memory system and the electronic system may be improved.

While embodiments of inventive concepts have been described with reference to the accompanying drawings, it will be understood by those of ordinary skill in the art that various changes in form and details may be made therein without departing from the spirit and scope of the example embodiments as defined by the appended claims. These embodiments should be considered in a descriptive sense only and not for purposes of limitation.

What is claimed is:

1. A memory system, comprising:
  a controller;
  a first rank including a plurality of first semiconductor memory devices;
  a second rank including a plurality of second semiconductor memory devices;
  command/address signal lines shared by the controller, the first rank, and the second rank; and
  data lines shared by the controller, the first rank, and the second rank, wherein
    when performing a data movement operation of moving data between the first rank and the second rank, the controller is configured to, (i) apply a shift read command to one of the first rank and the second rank through the command/address signal lines, and (ii) apply a normal write command or a shift write command to another of the first rank and the second rank through the command/address signal lines after a time corresponding to a value obtained by subtracting a value of a write latency from a value of a read latency, and for a number of clock cycles corresponding to a value of a burst length, data from one of the first rank and the second rank is written to another of the first rank and the second rank through the data lines.

2. The memory system of claim 1, wherein the first rank and the second rank are in one of a same memory module and different memory modules.

3. The memory system of claim 2, further comprising:
a data strobe signal line shared by the controller, the first rank, and the second rank, wherein,
when the shift read command is input, each of the first semiconductor memory devices and each of the second semiconductor memory devices are configured to output the data for the number of clock cycles corresponding to the value of the burst length to the data lines such that the data is aligned to a center of a data strobe signal output to the data strobe signal line from a time which is the same as a case in which a normal read command is input or a time which is preceded or delayed by a first delay time compared with the case in which the normal read command is input, the first delay time being one half of a time to output one-bit data.

4. The memory system of claim 3, wherein the controller is configured to,
generate a shift mode signal in a first state together with the normal read command as the shift read command, and
generate the shift mode signal in the first state together with the normal write command as the shift write command, and wherein
the shift mode signal is input through a terminal which is not used to input a column address signal, of each of the first semiconductor memory devices and the second semiconductor memory devices.

5. The memory system of claim 4, wherein, when the shift write command is input, each of the first semiconductor memory devices and the second semiconductor memory devices is configured to input the data for the number of clock cycles corresponding to the value of the burst length such that the data is aligned to the center of the data strobe signal from a time which is delayed by the first delay time or a second delay time compared with a case in which the normal write command is input, the second delay time being the time to output the one-bit data.

6. The memory system of claim 2, wherein, the first semiconductor memory devices use a first protocol, k ones of the semiconductor memory devices use the first protocol and l ones of the semiconductor memory devices use a second protocol different from the first protocol, and a total number of the second semiconductor memory devices is n, where k and l are integers and n=k+l,
the second rank further includes a memory interface unit configured to,
convert a command/address and data transmitted through the command/address signal lines and the data lines using the first protocol from the controller, transmit the command/address and the data to the l second semiconductor memory devices,
convert the data transmitted using the second protocol output from the l second semiconductor memory devices into data using the first protocol, and
output the data using the first protocol to the data lines, and
each of the first semiconductor memory devices, each of the k second semiconductor memory devices, and the memory interface unit, when the shift read command is input, output the data to the data lines for the number of clock cycles corresponding to the value of the burst length such that the data is aligned to a center of a data strobe signal from a time which is the same as a case in which the normal read command is input or a time which is preceded or delayed by a first delay time compared with the case in which the normal read command is input, the first delay time being one half of a time to output one-bit data.

7. The memory system of claim 6, wherein the controller is configured to,
input a shift mode signal in a first state together with the normal read command as the shift read command to each of the first semiconductor memory devices, each of the k second semiconductor memory devices, and the memory interface unit, and
input the shift mode signal in the first state together with the normal write command as the shift write command to each of the first semiconductor memory devices, each of the k second semiconductor memory devices, and the memory interface unit, wherein
the controller is configured to input the shift mode signal through a terminal which is not used to input a column address signal, of each of the first semiconductor memory devices, the k second semiconductor memory devices, and the memory interface unit.

8. The memory system of claim 7, wherein when the shift write command is input, each of the first semiconductor memory devices, each of the k second semiconductor memory devices, and the memory interface unit is configured to input data for the number of clock cycles corresponding to the value of the burst length such that the data is aligned to a center of a data strobe signal from a time which is delayed by the first delay time or a second delay time compared with a case in which the normal write command is input, the second delay time being the time to output the one-bit data.

9. A memory module, comprising:
a rank including a plurality of semiconductor memory devices, wherein
values of a read latency, a write latency, and a burst length are set for the rank, and
when a normal read command is input, the rank is configured to perform a normal read operation to output data for a number of clock cycles corresponding to a value of the burst length such that the data is aligned to an edge of a data strobe signal from a time which is delayed by a number of clock cycles corresponding to a value of the read latency,
when a shift read command is input, the rank is configured to perform a shift read operation to output the data for the number of clock cycles corresponding to the value of the burst length such that the data is aligned to a center of the data strobe signal from a time which is preceded or delayed by the number of clock cycles corresponding to the value of the read latency or a time which is preceded or delayed by a first delay time compared with the number of clock cycles corresponding to the value of the read latency, the first delay time being one half of a time to output one-bit data, and
when a normal write command is input, the rank is configured to perform a normal write operation to input the data for the number of clock cycles corresponding to the value of the burst length such that the data is aligned to a center of a data strobe signal from a time which is preceded by the first delay time compared with the number of clock cycles corresponding to the value of the write latency.

10. The memory module of claim 9, wherein,
when a shift mode signal in a first state is input together with the normal read command, the rank is configured to generate the shift read command,
when the shift mode signal in the first state is input together with the normal write command, the rank is configured to generate a shift write command, and wherein
the shift mode signal is input through a terminal which is not used to input a column address signal, of each of the semiconductor memory devices.

11. The memory module of claim 10, wherein, when the shift write command is input, each of the semiconductor memory devices is configured to perform a shift write operation to input data for the number of clock cycles corresponding to the value of the burst length such that the data is aligned to the center of the data strobe signal input from a time which is delayed by the first delay time or a second delay time compared with the number of clock cycles corresponding to the value of the write latency, the second delay time being the time to output the one-bit data.

12. The memory module of claim 9, wherein, k ones of the semiconductor memory devices use a first protocol and l ones of the semiconductor memory devices use a second protocol different from the first protocol, a total number of the semiconductor memory devices is n, where k and l are integers and n=k+l, and wherein the rank further comprises:
a memory interface unit configured to,
convert a command/address and data input using the first protocol into a command/address and data using the second protocol,
transmit the converted command/address and data to the l semiconductor memory devices,
convert the data input using the second protocol output from the l semiconductor memory devices into data using the first protocol,
perform the normal read operation when the normal read command is input,
perform the shift read operation when the shift read command is input.

13. The memory module of claim 12, wherein,
when a shift mode signal in a first state is input together with the normal read command, each of the k semiconductor memory devices and the memory interface unit is configured to generate the shift read command, and
when the shift mode signal in the first state is input together with the normal write command, the memory interface unit is configured to generate a shift write command, and wherein
the shift mode signal is input through a terminal which is not used to input a column address signal, of each of the k semiconductor memory devices and the memory interface unit.

14. The memory module of claim 13, wherein,
when the shift write command is input, each of the k semiconductor memory devices and the memory interface unit are configured to perform a shift write operation to input data for the number of clock cycles corresponding to the value of the burst length such that the data is aligned to the center of the data strobe signal input from a time which is delayed by the first delay time or a second delay time compared with the number of clock cycles corresponding to the value of the write latency, the second delay time being a time to output the one-bit data.

15. A semiconductor memory device, comprising:
a memory cell array including a plurality of memory cells selected by a row address signal and a column address signal input from the outside;
a command decoder configured to decode a command signal and generate one or more of a mode setting command, a normal read command, a shift read command, and a normal write command; and
a mode setting register configured to store values of a read latency, a write latency, and a burst length in response to the mode setting command, wherein
when the normal read command is input, the semiconductor memory device is configured to perform a normal read operation to output data for a number of clock cycles corresponding to the value of the burst length such that the data is aligned to an edge of a data strobe signal from a time which is delayed by the number of clock cycles corresponding to the value of the read latency,
when the shift read command is input, the semiconductor memory device is configured to perform a shift read operation to output the data for the number of clock cycles corresponding to the value of the burst length output such that the data is aligned to a center of the data strobe signal from the time which is preceded or delayed by the number of clock cycles corresponding to the value of the read latency or a time which is preceded or delayed by a first delay time compared with the number of clock cycles corresponding to the value of the read latency, the first delay time being half a time to output one-bit data, and
when the normal write command is input, the semiconductor memory device is configured to perform a normal write operation to write data during the number of clock cycles corresponding to the value of the burst length such that the data is aligned to the center of a data strobe signal from a time preceded by the first delay time compared with the number of clock cycles corresponding to the value of the write latency to the selected memory cells.

16. The semiconductor memory device of claim 15, wherein
the command decoder is configured to generate the shift read command when a shift mode signal in a first state is input together with the normal read command, and wherein
the shift mode signal is input through a terminal which is not used to input the column address signal of the semiconductor memory device.

17. The semiconductor memory device of claim 16, wherein the semiconductor memory device further comprises:
an internal clock signal generator configured to receive an external clock signal, and to generate (i) an internal clock signal locked to the external clock signal, and (ii) internal clock signals delayed and locked by 90, 180, and 270 degrees from the external clock signal;
a latency controller configured to,
generate, when the normal read command is generated, a normal read control signal which is delayed and activated by the number of clock cycles corresponding to the value of the read latency in response to the internal clock signal locked to the external clock signal and delayed and deactivated by the number of clock cycles corresponding to the value of the burst length, generate, when the shift read command is generated, a shift read control signal which is delayed and activated by a time obtained by subtracting the first delay time from the number of clock cycles corresponding to the value of the read latency in response to the internal clock signal being delayed and locked by the 270 degrees from the external clock signal and delayed and deactivated by the number of clock cycles corresponding to the burst length, and generate, when the normal write command is generated, a normal write control signal which is delayed and activated by a time obtained by subtracting the first delay time from the number of clock cycles corresponding to the value of the write latency in response to the internal clock signal being delayed and locked by the 270 degrees from the external clock signal and delayed and deactivated by the number of clock cycles corresponding to the value of the burst length;

a data read unit configured to, output data for the number of clock cycles corresponding to the value of the burst length such that the data is aligned to an edge of a data strobe signal generated in response to the internal clock signal locked to the external clock signal during an activation period of the normal read control signal, and output the data for the number of clock cycles corresponding to the value of the burst length such that the data is aligned to a center of the data strobe signal during an activation period of the shift read control signal; and a data write unit configured to write data for the number of clock cycles corresponding to the value of the burst length such that the data is aligned to the center of the data strobe signal during an activation period of the normal write control signal.

18. The semiconductor memory device of claim 15, wherein the command decoder is configured to generate a shift write command when a shift mode signal in a first state is input together with the normal write command, and wherein the shift mode signal is input through a terminal which is not used to input the column address signal of the semiconductor memory device.

19. The semiconductor memory device of claim 18, wherein, when the shift write command is generated, the semiconductor memory device is configured to perform a shift write operation to write data for a number of clock cycles corresponding to the value of the burst length such that the data is aligned to the center of the data strobe signal input from a time which is delayed by the first delay time or a second delay time compared with the normal write operation, the second delay time being a time to output one-bit data.

20. The semiconductor memory device of claim 19, wherein the semiconductor memory device further comprises:

an internal clock signal generator configured to receive an external clock signal, and to generate (i) an internal clock signal locked to the external clock signal, and (ii) internal clock signals which are delayed and locked by 90, 180, and 270 degrees from the external clock signal;

a latency controller configured to, generate, when the normal read command is generated, a normal read control signal which is delayed and activated by the number of clock cycles corresponding to the value of the read latency in response to the internal clock signal locked to the external clock signal and delayed and deactivated by the number of clock cycles corresponding to the value of the burst length, generate, when the shift read command is generated, a shift read control signal which is delayed and activated by a time obtained by adding the first delay time to the value of the read latency in response to the internal clock signal being locked to the external clock signal or the internal clock signal being delayed and locked by the 90 degrees from the external clock signal and delayed and deactivated by the number of clock cycles corresponding to the value of the burst length, generate, when the normal write command is generated, a normal write control signal which is delayed and activated by a time obtained by subtracting the first delay time from the number of clock cycles corresponding to the value of the write latency in response to the internal clock signal being delayed and locked by the 270 degrees from the external clock signal and delayed and deactivated by the number of clock cycles corresponding to the value of the burst length, and generate, when the shift write command is generated, a shift write control signal which is delayed and activated by a time obtained by adding the first delay time to the number of clock cycles corresponding to the value of the write latency in response to the internal clock signal which is delayed and locked by the 90 degrees from the external clock signal or the internal clock signal being locked to the external clock signal and delayed and deactivated by the number of clock cycles corresponding to the value of the burst length;

a data read unit configured to, output data for the number of clock cycles corresponding to the value of the burst length such that the data is aligned to an edge of a data strobe signal generated in response to the internal clock signal locked to the external clock signal during an activation period of the normal read control signal, and output the data for the number of clock cycles corresponding to the value of the burst length such that the data is aligned to a center of the data strobe signal during an activation period of the shift read control signal; and a data write unit configured to write data for the number of clock cycles corresponding to the value of the burst length such that the data is aligned to the center of the data strobe signal input during an activation period of the normal write control signal or the shift write control signal.

* * * * *